United States Patent
Liu et al.

(10) Patent No.: US 11,532,602 B2
(45) Date of Patent: Dec. 20, 2022

(54) DISPLAY PANEL AND METHOD FOR MANUFACTURING DISPLAY PANEL

(71) Applicant: BOE TECHNOLOGY GROUP CO., LTD., Beijing (CN)

(72) Inventors: Chao Liu, Beijing (CN); Yujun Zhang, Beijing (CN); Jing Yu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 332 days.

(21) Appl. No.: 16/753,955

(22) PCT Filed: May 28, 2019

(86) PCT No.: PCT/CN2019/088779
§ 371 (c)(1),
(2) Date: Apr. 6, 2020

(87) PCT Pub. No.: WO2020/038032
PCT Pub. Date: Feb. 27, 2020

(65) Prior Publication Data
US 2020/0312820 A1 Oct. 1, 2020

(30) Foreign Application Priority Data
Aug. 22, 2018 (CN) .......................... 201810960302.1

(51) Int. Cl.
*H01L 25/075* (2006.01)
*H05K 1/18* (2006.01)
*H05K 3/32* (2006.01)

(52) U.S. Cl.
CPC ......... *H01L 25/0753* (2013.01); *H05K 1/189* (2013.01); *H05K 3/32* (2013.01);
(Continued)

(58) Field of Classification Search
CPC ..... H01L 25/0753; H01L 33/62; H01L 27/32; H05K 1/189; H05K 1/181; H05K 1/147;
(Continued)

(56) References Cited

U.S. PATENT DOCUMENTS

2002/0149074 A1 10/2002 Imaeda
2018/0188579 A1* 7/2018 Jeong ................ G02F 1/136286

FOREIGN PATENT DOCUMENTS

CN  101502189 A  8/2009
CN  101636689 A  1/2010
(Continued)

OTHER PUBLICATIONS

PCT International Search Report, Application No. PCT/CN2019/088779, dated Sep. 2, 2019, 6 pages: with English translation.
(Continued)

*Primary Examiner* — Anne M Hines
*Assistant Examiner* — Jose M Diaz
(74) *Attorney, Agent, or Firm* — Armstrong Teasdale LLP

(57) ABSTRACT

The present disclosure relates to a display panel and a method for manufacturing a display panel. The display panel includes a first substrate having a first wiring, a second substrate having a second wiring, the first substrate, and the second substrate being laminated on each other to form a laminated structure, and a third wiring located on a side surface of the laminated structure, wherein the third wiring connects the first wiring and the second wiring.

14 Claims, 3 Drawing Sheets

(52) U.S. Cl.
CPC .............. *H05K 2201/09981* (2013.01); *H05K 2201/10106* (2013.01); *H05K 2201/10128* (2013.01); *H05K 2203/1469* (2013.01)

(58) Field of Classification Search
CPC ........... H05K 3/32; H05K 2201/09981; H05K 2201/10106; H05K 2201/10128; H05K 2203/1469
See application file for complete search history.

(56) References Cited

FOREIGN PATENT DOCUMENTS

| | | | |
|---|---|---|---|
| CN | 107065334 | A | 8/2017 |
| CN | 108231852 | A | 6/2018 |
| CN | 108267903 | A | 7/2018 |
| JP | 2017183684 | A | 10/2017 |

OTHER PUBLICATIONS

PCT Written Opinion, Application No. PCT/CN2019/088779, dated Sep. 2, 2019, 5 pages: with English translation of relevant part.
China First Office Action, Application No. 201810960302.1, dated Dec. 2, 2019, 14 pps.: with English translation.
China Second Office Action, Application No. 201810960302.1, dated Aug. 13, 2020, 11 pps.: with English translation.

\* cited by examiner

DISPLAY PANEL AND METHOD FOR MANUFACTURING DISPLAY PANEL

CROSS REFERENCE TO RELATED APPLICATIONS

This patent application is a National Stage Entry of PCT/CN2019/088779 filed on May 28, 2019, which claims the benefit and priority of Chinese Patent Application No. 201810960302.1 filed on Aug. 22, 2018, the disclosures of which are incorporated by reference herein in their entirety as part of the present application.

BACKGROUND

Embodiments of the present disclosure relate to a field of displaying technology, in particular, to a display panel and a method for manufacturing a display panel.

With the development of display technology, display devices are developing towards ultra-thin display devices, ultra-narrow frame display devices, or even frameless display devices. However, it is difficult for current narrow frame display devices technology to achieve four-side frames narrowing.

BRIEF DESCRIPTION

Embodiments of the present disclosure provide a display panel and a method for manufacturing a display panel.

One aspect of the present disclosure provides a display panel. The display panel includes a first substrate having a first wiring, a second substrate having a second wiring, the first substrate, and the second substrate being laminated on each other to form a laminated structure, and a third wiring located on a side surface of the laminated structure, wherein the third wiring connects the first wiring and the second wiring.

In an embodiment of the present disclosure, the first wiring is located on a side of the first substrate away from the second substrate, and the second wiring is located on a side of the second substrate away from the first substrate.

In an embodiment of the present disclosure, the first substrate further includes a light emitting device located on the same side as the first wiring located, and the second substrate further includes a flexible printed circuit board located on the same side as the second wiring located.

In an embodiment of the present disclosure, the first substrate and the second substrate have the same size and shape.

In an embodiment of the present disclosure, the first substrate further includes a first protective layer covering the first wiring. The second substrate further includes a second protective layer covering the second wiring. The display panel further includes a third protective layer covering the third wiring.

In an embodiment of the present disclosure, the display panel further includes an adhesive layer located between the first substrate and the second substrate.

In an embodiment of the present disclosure, portions, located at least in an edge region of the display panel, of the first wiring and the second wiring are aligned with each other along a laminated direction.

In an embodiment of the present disclosure, the first wiring and the second wiring have the same line width and spacing.

A second aspect of the present disclosure provides a method for manufacturing a display panel. The method includes providing a first substrate having a first wiring, providing a second substrate having a second wiring, joining the first substrate and the second substrate to form a laminated structure, and forming a third wiring on a side surface of the laminated structure to connect the first wiring and the second wiring.

In an embodiment of the present disclosure, joining the first substrate and the second substrate includes joining a side of the first substrate away from the first wiring and a side of the second substrate away from the second wiring.

In an embodiment of the present disclosure, providing the first substrate further includes disposing a light emitting device on a side of the first substrate on which the first wiring is formed, and providing the second substrate further includes disposing a flexible printed circuit board on a side of the second substrate on which the second wiring is formed.

In an embodiment of the present disclosure, forming the third wiring includes forming a conductive layer on a side surface of the laminated structure, and patterning the conductive layer to form the third wiring.

In an embodiment of the present disclosure, the method further includes grinding the side surface of the laminated structure before forming the third wiring.

In an embodiment of the present disclosure, providing the first substrate further includes forming a first protective layer on a side of the first substrate on which the first wiring is formed. Providing the second substrate further includes forming a second protective layer on a side of the second substrate on which the second wiring is formed. After the third wiring is formed, the method further includes forming a third protective layer covering the third wiring.

In an embodiment of the present disclosure, before joining the first substrate and the second substrate, an adhesive layer is formed on a surface to be joined of at least one of the first substrate and the second substrate.

Adaptive and further aspects and scope will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several views of the drawings.

DETAILED DESCRIPTION

Figure 1:
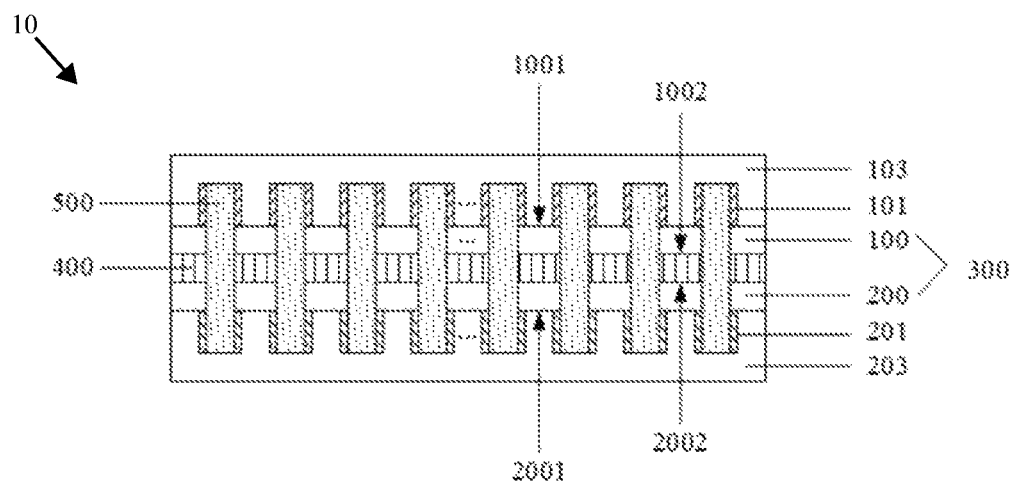
FIG. 1 is a cross-sectional view of a display panel according to an embodiment of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. The term "example" used herein, particularly when followed by a listing of terms, is merely exemplary and illustrative and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

In addition, in the drawings, the thickness and area of each layer are exaggerated for clarity. It should be understood that when a layer, a region, or a component is referred to as being "on" another part, it is meant that it is directly on another part, or there may be other components in between. In contrast, when a certain component is referred to as being "directly" on another component, it is meant that no other component lies in between.

The flow diagrams depicted herein are just one example. There may be many variations to this diagram or the steps (or operations) described therein without departing from the spirit of the disclosure. For instance, the steps may be performed in a differing order or steps may be added, deleted, or modified. All of these variations are considered a part of the claimed disclosure.

Exemplary embodiments will now be described more fully with reference to the accompanying drawings.

At present, display devices are developing towards ultra-thin display devices, ultra-narrow frame display devices, or even frameless display devices. However, it is difficult for current narrow frame display devices technology to achieve four-side frames narrowing. In order to achieve frame narrowing, the electrode on the thin film transistor can be connected to the back electrode by silver conductive wires on the side, so that the bonding region of 1.0~2.0 mm can be canceled, so as to achieve a splicing product (for example, LED splicing screen) having splicing seams of 0.3 mm and even smaller. However, this method involves performing a wiring process on both sides of the same substrate. When the wiring process is performed on the back side, the wiring on the front side is likely to be damaged. In addition, the process of mounting the light emitting device on the front side and the process of the mounting the flexible printed circuit board on the back side will affect each other, so that difficulty of the process is relatively large.

The embodiments of the present disclosure provide a display panel and a method for manufacturing a display panel. By performing wiring processes on two substrates, respectively, the cost can be reduced and the process difficulty as described above can be decreased. In addition, by connecting the electrodes on the two substrates with the side wiring, the bonding region can be cancelled, thereby realizing a narrow frame display.

Figure 2:
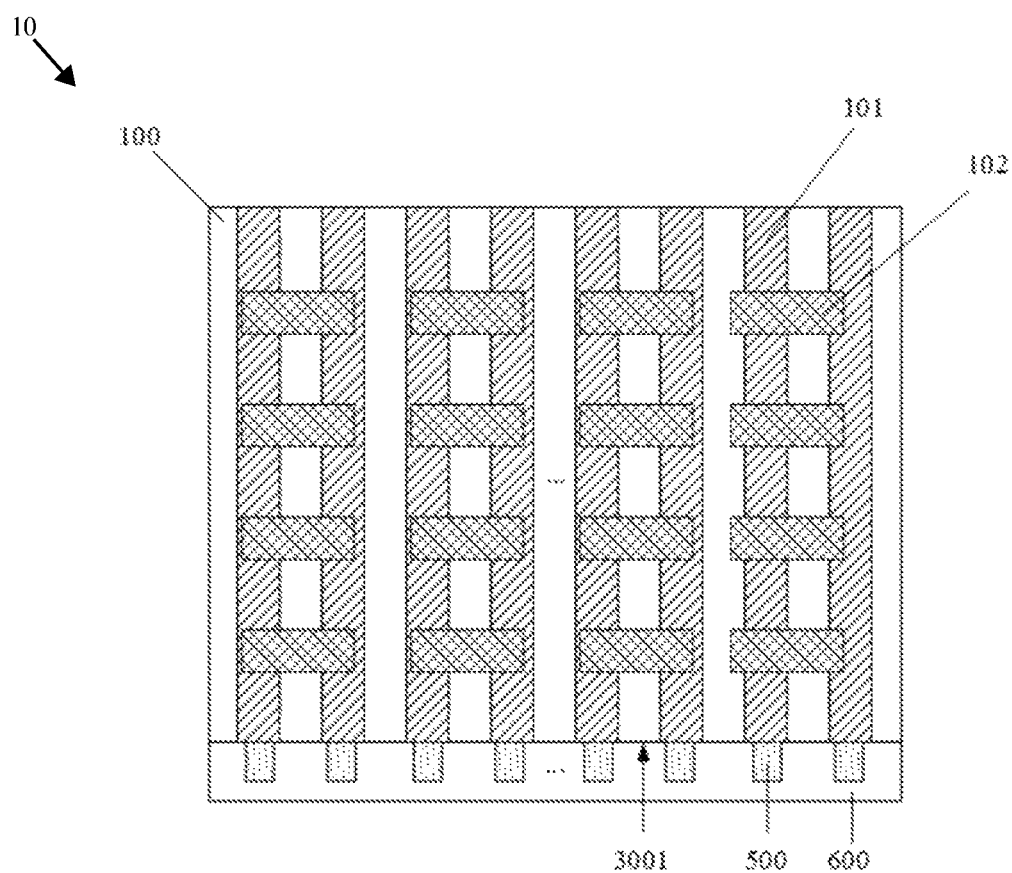
FIG. 2 is a top view of a display panel according to an embodiment of the present disclosure.
Figure 3:
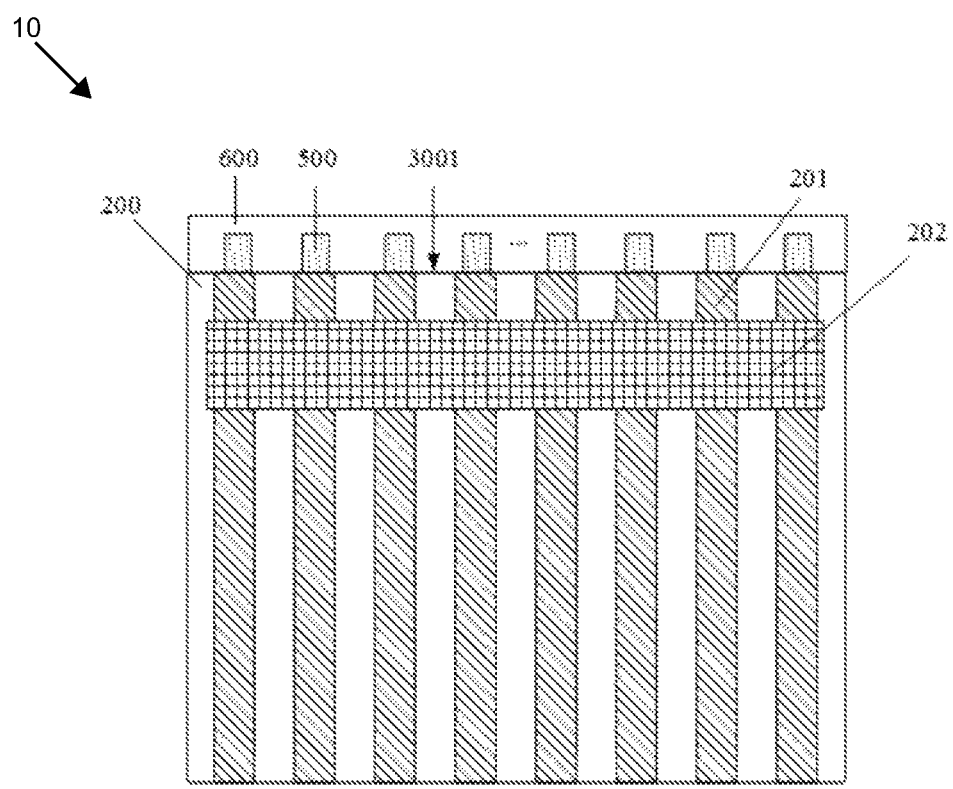
FIG. 3 is a bottom view of a display panel according to an embodiment of the present disclosure.

FIG. 1 is a cross-sectional view of a display panel according to an embodiment of the present disclosure. FIG. 2 is a top view of a display panel according to an embodiment of the present disclosure. FIG. 3 is a bottom view of a display panel according to an embodiment of the present disclosure.

Referring to FIGS. 1 to 3, the display panel 10 includes a first substrate 100 having a first wiring 101 and a second substrate 200 having a second wiring 201. The first substrate 100 and the second substrate 200 are laminated on each other to form a laminated structure 300. The display panel 10 further includes a third wiring 500 located on a side surface 3001 of the laminated structure 300. The third wiring 500 connects the first wiring 101 and the second wiring 201.

In an exemplary embodiment of the present disclosure, a material of the third wiring 500 may include silver.

In an embodiment of the present disclosure, as shown in FIG. 1, the first wiring 101 is located on a side 1001 of the first substrate 100 away from the second substrate 200, and the second wiring 201 is located on a side 2001 of the second substrate 200 away from the first substrate 100.

In an embodiment of the present disclosure, as shown in FIG. 2, the first substrate 100 further includes a light emitting device 102 located on the same side as the first wiring 101 located. As an example, the light emitting device 102 may include, for example, a mini LED or a micro LED.

In an embodiment of the present disclosure, as shown in FIG. 3, the second substrate 200 further includes a flexible printed circuit board 202 or other driving elements such as a driving chip, etc. on the same side as the second wiring 201 located.

In an embodiment of the present disclosure, the first substrate 100 and the second substrate 200 have the same size and shape. As an example, the first substrate 100 and the second substrate 200 may be square or rectangular. The sizes and shapes of the first substrate 100 and the second substrate 200 shown in FIGS. 2 and 3 are only exemplary, which should not be considered as a limit to the present disclosure, and those skilled in the art may design it according to actual needs.

In an embodiment of the present disclosure, as shown in FIG. 1, the first substrate 100 may further include a first protective layer 103 covering the first wiring 101. The second substrate 200 may further include a second protective layer 203 covering the second wiring 201. In an embodiment of the present disclosure, as shown in FIGS. 2 and 3, the display panel 10 may further include a third protective layer 600 covering the third wiring 500. It can be understood that the coverage area of the third protective layer 600 shown in FIGS. 2 and 3 is only exemplary, and it should not be considered as a limit to the present disclosure. As an example, in order to protect the third wiring 500 more effectively, the third protective layer 600 may surround the entire side surface 3001 of the laminated structure 300 (not shown in FIGS. 2 and 3).

In an embodiment of the present disclosure, as shown in FIG. 1, the display panel 10 further includes an adhesive layer 400 located between the first substrate 100 and the second substrate 200. As an example, the adhesive layer 400 may include a sealant or a filler. The adhesive layer 400 substantially completely fills a gap between the first substrate 100 and the second substrate 200. The adhesive layer 400 is in direct contact with the first substrate 100 and the second substrate 200. That is, the first substrate 100, the adhesive layer 400, and the second substrate 200 constitute the laminated structure 300.

In an embodiment of the present disclosure, as shown in FIG. 1, portions, located at least in an edge region of the display panel 10, of the first wiring 101 and the second wiring 201 are aligned with each other along a laminated direction, which should not be considered as a limit to the present disclosure. It can be understood that other portions, outside the edge region of the display panel 10, of the first wiring 10 and the second wiring 201 may be misaligned, and those skilled in the art may design it according to actual needs. It should be understood that the laminated direction may be a direction perpendicular to the first substrate 100 or the second substrate 200.

In an embodiment of the present disclosure, as shown in FIG. 1, the first wiring 101 and the second wiring 201 have the same line width and spacing, which should not be considered as a limit to the present disclosure. It can be understood that the first wiring 101 and the second wiring 201 may also have the same line width and different spacing, have different line width and the same spacing, or have different line width and spacing. Those skilled in the art may design it according to actual needs.

It should be noted that the arrangement of the first wiring 101 and the second wiring 201 in the display panel 10 shown in FIGS. 1 to 3 is merely exemplary, and it should not be considered as a limit to the present disclosure. Those skilled in the art may design it according to actual needs.

The embodiments of the present disclosure also provide a method for manufacturing a display panel, which can reduce process cost and process difficulty.

Figure 4:
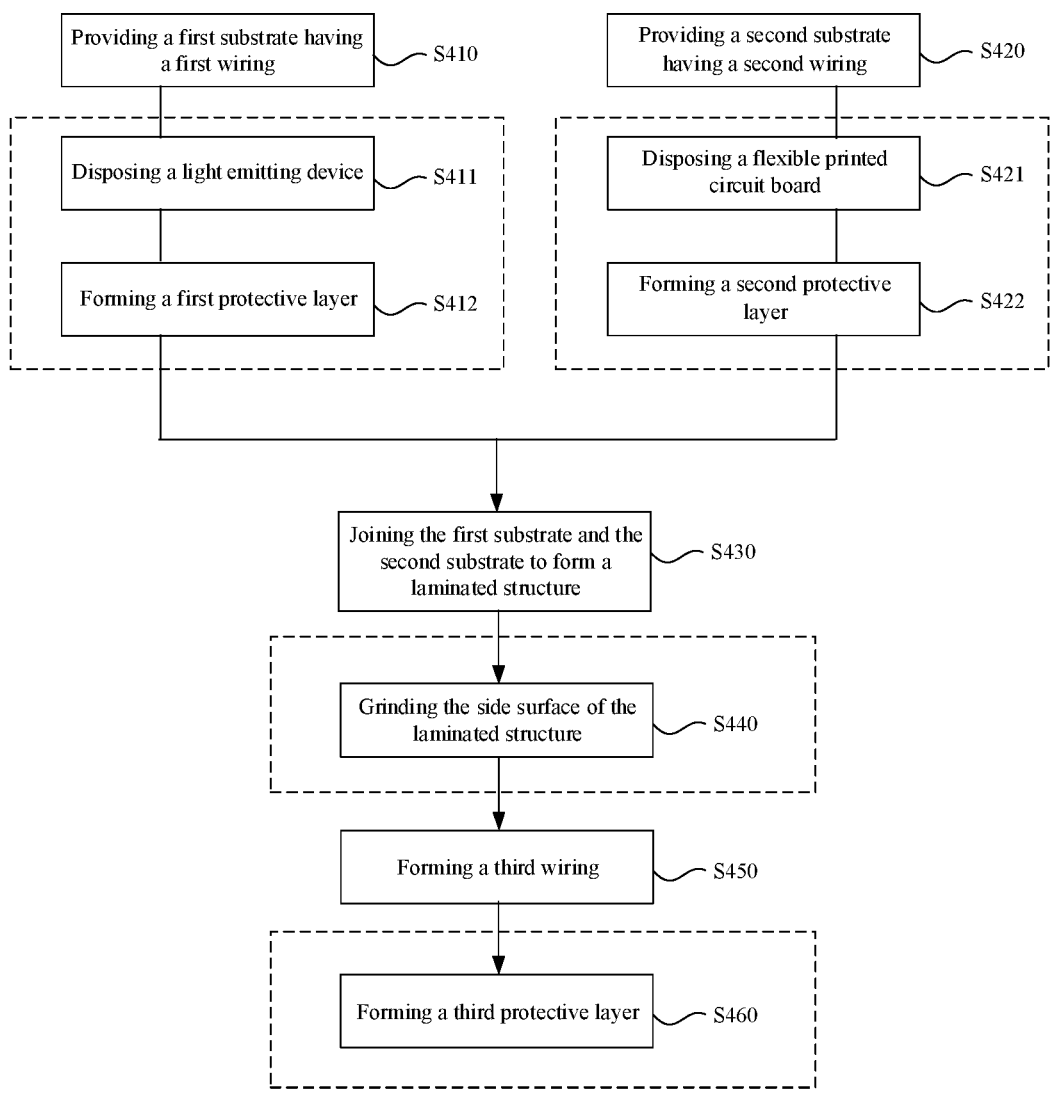
FIG. 4 is a flowchart of a method for manufacturing a display panel according to an embodiment of the present disclosure.

FIG. 4 is a flowchart of a method for manufacturing a display panel according to an embodiment of the present disclosure. As shown in FIG. 4, the above method may include steps S410, S420, S430 to S450. It should be noted that the steps in the dashed block shown in FIG. 4 are optional steps.

Next, a method for manufacturing a display panel according to an embodiment of the present disclosure will be described with reference to FIGS. 1 to 4. The method includes in step S410, providing a first substrate 100 having a first wiring 101, in step S420, providing a second substrate 200 having a second wiring 201, in step S430, joining the first substrate 100 and the second substrate 200 to form a laminated structure 300, and in step S450, forming a third wiring 500 on a side surface of the laminated structure 300 to connect the first wiring 101 and the second wiring 102.

In an embodiment of the present disclosure, referring to FIG. 1, in step S430, joining the first substrate 100 and the second substrate 200 includes joining a side 1002 of the first substrate 100 away from the first wiring 101 and a side 2002 of the second substrate 200 away from the second wiring 201.

In an embodiment of the present disclosure, referring to FIG. 2, providing the first substrate 100 further includes in step S411, providing a light emitting device 102 on a side of the first substrate 100 where the first wiring 101 is formed. As an example, the light emitting device 102 may include, for example, a mini LED or a micro LED.

In an embodiment of the present disclosure, referring to FIG. 3, providing the second substrate 200 further includes in step S421, providing a flexible printed circuit board 202 on a side of the second substrate 200 where the second wiring 201 is formed.

In an embodiment of the present disclosure, referring to FIGS. 1 to 4, in step S450, forming the third wiring 500 includes forming a conductive layer (not shown) on a side surface 3001 of the laminated structure 300, and patterning the conductive layer to form the third wiring 500. In an exemplary embodiment of the present disclosure, a material of the third wiring 500 may include silver.

In an embodiment of the present disclosure, before forming the third wiring 500, as described in step S440, the side surface 3001 of the laminated structure 300 is ground. Specifically, the side surface 3001 of the laminated structure 300 is subjected to vertically edge grinding, so that the terminals of the first wiring 101 and the second wiring 201 are exposed on the side surface 3001 of the laminated structure 300, thereby preparing the third wiring 500 in subsequent step so as to connect the first wiring 101 and the second wiring 201.

In an embodiment of the present disclosure, referring to FIGS. 1 to 4, after step S411 and before step S430, the method further includes step S412. That is, providing the first substrate 100 further includes forming a first protective layer 103 on a side of the first substrate 100 where the first wiring 101 is formed, so as to protect the first wiring 101 and the light emitting device 102 from the external environment.

In an embodiment of the present disclosure, referring to FIGS. 1 to 4, after step S421 and before step S430, the method further includes step S422. That is, providing the second substrate 200 further includes forming a second protective layer 203 on a side of the second substrate 200 where the second wiring 201 is formed, so as to protect the first wiring 101 and the light emitting device 102 from the external environment.

In an embodiment of the present disclosure, referring to FIGS. 1 to 4, after step S450, the method further includes step S460. That is, after forming the third wiring 500, the method further includes forming a third protective layer 600 covering the third wiring 500, so as to protect the third wiring 500 from the external environment.

In an embodiment of the present disclosure, before step S430, that is, before joining the first substrate 100 and the second substrate 200, an adhesive layer 400 (as shown in FIG. 1) is formed on a surface to be joined of at least one of the first substrate 100 and the second substrate 200. Specifically, the adhesive layer 400 is formed on a side 1002 of the first substrate 100 near the second substrate 200 or on a side 2002 of the second substrate 200 near the first substrate 100 to join the first substrate 100 and the second substrate 200.

In an embodiment of the present disclosure, a wiring process is performed on two substrates (for example, a first substrate and a second substrate) respectively, which can reduce the cost and decrease the process difficulty compared with a process in which wiring is performed on both sides of a single substrate. In addition, by disposing a third wiring, the first wiring included in the first substrate and the second wiring included in the second substrate can be connected, thereby canceling the bonding region and thus achieving a narrow frame display and achieving splicing screen display of smaller seams (for example, 0.3 mm).

The foregoing description of the embodiment has been provided for purpose of illustration and description. It is not intended to be exhaustive or to limit the application. Even if not specifically shown or described, individual elements or features of a particular embodiment are generally not limited to that particular embodiment, are interchangeable when under a suitable condition, can be used in a selected embodiment and may also be varied in many ways. Such variations are not to be regarded as a departure from the application, and all such modifications are included within the scope of the application.

What is claimed is:

1. A display panel comprising:
   a first substrate having a first wiring;

a second substrate having a second wiring, the first substrate and the second substrate laminated on each other to form a laminated structure; and a third wiring located on a side surface of the laminated structure, wherein the third wiring connects the first wiring and the second wiring, and wherein the first wiring and the second wiring have a same line width and spacing.

2. The display panel according to claim 1, wherein the first wiring is located on a side of the first substrate away from the second substrate, and wherein the second wiring is located on a side of the second substrate away from the first substrate.

3. The display panel according to claim 2, wherein the first substrate further comprises a light emitting device located on the same side as the first wiring, and wherein the second substrate further comprises a flexible printed circuit board located on the same side as the second wiring.

4. The display panel according to claim 2, wherein the first substrate and the second substrate have a same size and shape.

5. The display panel according to claim 1, wherein the first substrate further comprises a first protective layer covering the first wiring, wherein the second substrate further comprises a second protective layer covering the second wiring, and wherein the display panel further comprises a third protective layer covering the third wiring.

6. The display panel according to claim 1, further comprising an adhesive layer located between the first substrate and the second substrate.

7. The display panel according to claim 1, wherein portions, located at least in an edge region of the display panel, of the first wiring and the second wiring are aligned with each other along a laminated direction.

8. A method for manufacturing a display panel, the method comprising:
providing a first substrate having a first wiring;
providing a second substrate having a second wiring;
joining the first substrate and the second substrate to form a laminated structure; and forming a third wiring on a side surface of the laminated structure to connect the first wiring and the second wiring, wherein the first wiring and the second wiring have a same line width and spacing.

9. The method according to claim 8, wherein joining the first substrate and the second substrate comprises joining a side of the first substrate away from the first wiring and a side of the second substrate away from the second wiring.

10. The method according to claim 9, wherein providing the first substrate further comprises disposing a light emitting device on a side of the first substrate on which the first wiring is formed, and wherein providing the second substrate further comprises disposing a flexible printed circuit board on a side of the second substrate on which the second wiring is formed.

11. The method according to claim 8, wherein forming the third wiring comprises:
forming a conductive layer on the side surface of the laminated structure; and
patterning the conductive layer to form the third wiring.

12. The method according to claim 8, further comprising grinding the side surface of the laminated structure before forming the third wiring.

13. The method according to claim 8, wherein providing the first substrate further comprises forming a first protective layer on a side of the first substrate on which the first wiring is formed,
providing the second substrate further comprises forming a second protective layer on a side of the second substrate on which the second wiring is formed, and
after the third wiring is formed, the method further comprises forming a third protective layer covering the third wiring.

14. The method according to claim 9, wherein, before joining the first substrate and the second substrate, an adhesive layer is formed on a surface to be joined of at least one of the first substrate and the second substrate.

* * * * *